United States Patent [19]

Manning

[11] Patent Number: 5,759,881
[45] Date of Patent: Jun. 2, 1998

[54] LOW COST WELL PROCESS

[75] Inventor: Monte Manning, Kuna, Id.

[73] Assignee: Micron Technology, Inc., Boise, Id.

[21] Appl. No.: 881,873

[22] Filed: Jun. 23, 1997

Related U.S. Application Data

[63] Continuation of Ser. No. 547,100, Oct. 24, 1995, abandoned, which is a continuation of Ser. No. 120,098, Sep. 10, 1993, abandoned.

[51] Int. Cl.$^6$ .............................................. H01L 21/8238
[52] U.S. Cl. ........................ 438/199; 438/218; 438/225; 438/227
[58] Field of Search .................... 437/28, 34, 57, 437/52, 29; 438/199, 218, 225, 227

[56] References Cited

U.S. PATENT DOCUMENTS

| | | | |
|---|---|---|---|
| 4,697,332 | 10/1987 | Joy et al. | 437/29 |
| 4,713,329 | 12/1987 | Fang et al. | 437/28 |
| 4,728,619 | 3/1988 | Pfiester et al. | 437/34 |
| 4,839,305 | 6/1989 | Brighton | 437/41 |
| 4,882,289 | 11/1989 | Moriuchi et al. | 437/52 |
| 5,175,123 | 12/1992 | Vasquez et al. | 437/69 |
| 5,252,504 | 10/1993 | Lowrey et al. | 437/52 |

OTHER PUBLICATIONS

Wolf et al, "Silicon Processing for the VLSI Era", vol. II. Lattice Press, 1990, pp. 368–389.

Ghandhi; *VLSI Fabrication Principles*, John Wiley & Sons, Inc., 1983, pp. 353–354.

Wolf et al., vol. II, Silicon Processing for the VLSI Era, Lattice Press, 1990 pp. 20–28; 419–427; 428–441.

*Primary Examiner*—Charles L. Bowers, Jr.
*Assistant Examiner*—Yvonne A. Gurley

[57] ABSTRACT

The present invention develops a process for forming dual conductive wells in a silicon substrate for an integrated circuit by: forming an oxide layer on the silicon substrate; patterning an oxidation barrier layer on the oxide layer, thereby defining active areas for active devices; introducing first p-type conductive impurities into the silicon substrate thereby forming at least one p-type conductively doped well region; masking over the p-type conductively doped well region; introducing n-type conductive impurities into the silicon substrate thereby forming at least one n-type conductively doped well region; removing the masking; forming oxide regions in areas not covered by the patterned oxidation barrier layer; and forcing the p-type and n-type conductive impurities further into the silicon substrate thereby forming the dual well regions, the well regions having adequate conductive depth to provide for the formation of the active devices.

45 Claims, 2 Drawing Sheets

LOW COST WELL PROCESS

This is a continuation of U.S. patent application Ser. No. 08/547,100, filed Oct. 24, 1995, now abandoned, which is a continuation of U.S. patent application Ser. No. 08/120,093, now abandoned.

This invention was made with Government support under Contract No. MDA972-92-C-0054 awarded by Advanced Research Projects Agency (ARPA). The Government has certain rights in this invention.

FIELD OF THE INVENTION

This invention relates to semiconductor technology, and more specifically, to a process for forming N-Wells and P-Wells used in fabrication of integrated circuits.

BACKGROUND OF THE INVENTION

As NMOS and PMOS technology was merged to become CMOS technology this required both n-channel and p-channel transistors to be fabricated on the same wafer. Obviously, only one type of device can be fabricated on a given starting substrate. Therefore the process of forming doped regions (wells) of opposite doping polarity than that of the starting substrate was developed. This is done by implanting and diffusing an appropriate dopant to attain the proper well depth and doping profile.

Because one of the device types must be located in the well, the performance of the device will suffer as a consequence of the higher doping. The device will also exhibit higher junction capacitance, have increased sensitivity to body effect and decreased transconductance. To produce both n-channel and p-channel transistors having basically the same operating characteristics, both devices are fabricated in separate wells or dual wells.

A standard dual well fabrication process is complex and rather lengthy. As an example, a typical process will use the following steps. First, an initial pad oxide is grown followed by a nitride layer that is then patterned to define the well regions to be formed. With resist still covering the nitride, the N-Well implant is performed using phosphorus and/or arsenic. The resist is then stripped and an oxide is grown over the N-Well implanted areas but not over the areas covered with nitride. The nitride is then stripped and the P-Well implant is performed with the thick oxide covering the N-Well areas blocking the P-Well implant. All oxide is stripped from the wafer and then the wells are driven into the substrate using a high temperature diffusion process. After well drive, any oxide on the substrate is removed and a second pad oxide is grown, followed by a second nitride layer which is then patterned to define the device active areas. Field oxide is grown in the areas not protected by the nitride. The nitride and pad oxide is stripped and a sacrificial oxide is grown. This sacrificial oxide eliminates the Kooi effect caused by field oxidation in a steam ambient. (The Kooi effect is the nitridation of the silicon at the edges of the active areas defined by the second nitride, thus forming a thin oxynitride layer. The oxynitride layer blocks oxidation of the substrate, thereby creating thin oxide regions that break down at lower voltages than desired.) Performing the sacrificial oxidation followed by an oxide strip results in a clean substrate with no oxynitride layer to degrade the subsequent gate oxide formation The process described above is not only complex but it is also expensive as the process requires two masking steps, seven oxidation steps, and two nitride deposition steps. The present invention however, describes a process that achieves the same results by using three masking steps, three oxidation steps and one nitride deposition step, thereby resulting in a lower cost process by eliminating five diffusion operations at the expense of adding only one non-critical masking step.

SUMMARY OF THE INVENTION

A main focus of the present invention is to reduce the complexity of conventional well formation and accomplishes this in a well formation process that forms one or more conductive wells in a supporting substrate for an integrated circuit, with the process comprising the steps of:

forming an insulation layer on the supporting substrate;

patterning a barrier layer on the insulation layer, thereby defining active areas for active devices;

introducing conductive impurities into the supporting substrate thereby forming at least one conductively doped well region;

forming insulation regions in areas not covered by the patterned barrier layer; and forcing the conductive impurities further into the supporting substrate thereby forming the well region that has adequate conductive depth to provide for the formation of the active devices.

DETAILED DESCRIPTION OF THE INVENTION

Figure 1:
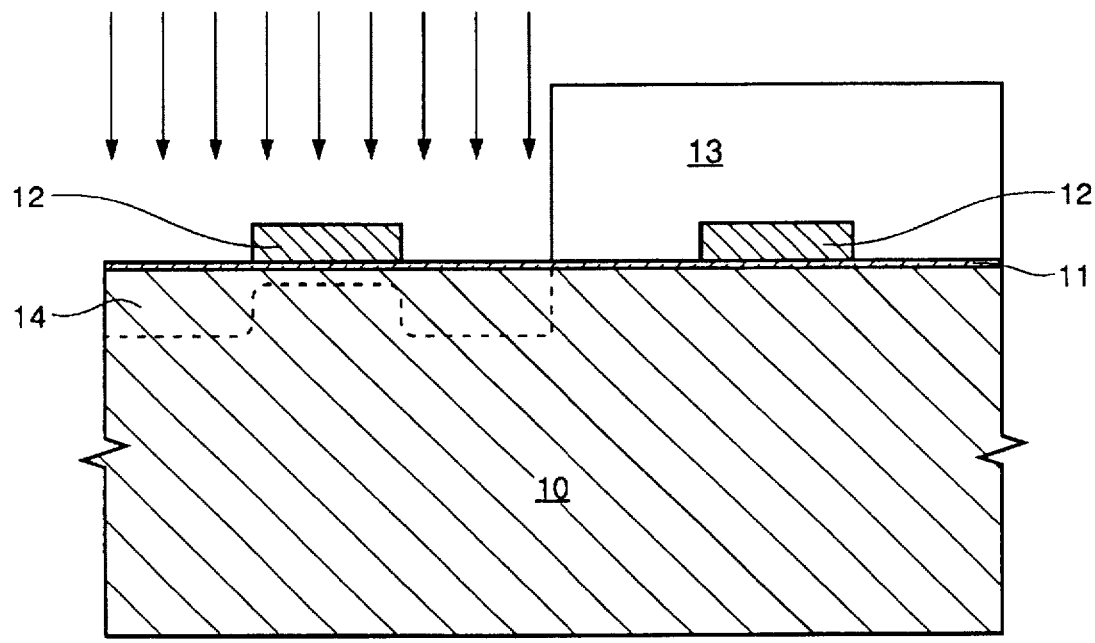
FIG. 1 depicts a supporting substrate coated with a thin oxide layer, a patterned nitride and resist masking, followed by an N-Well implant.
Figure 2:
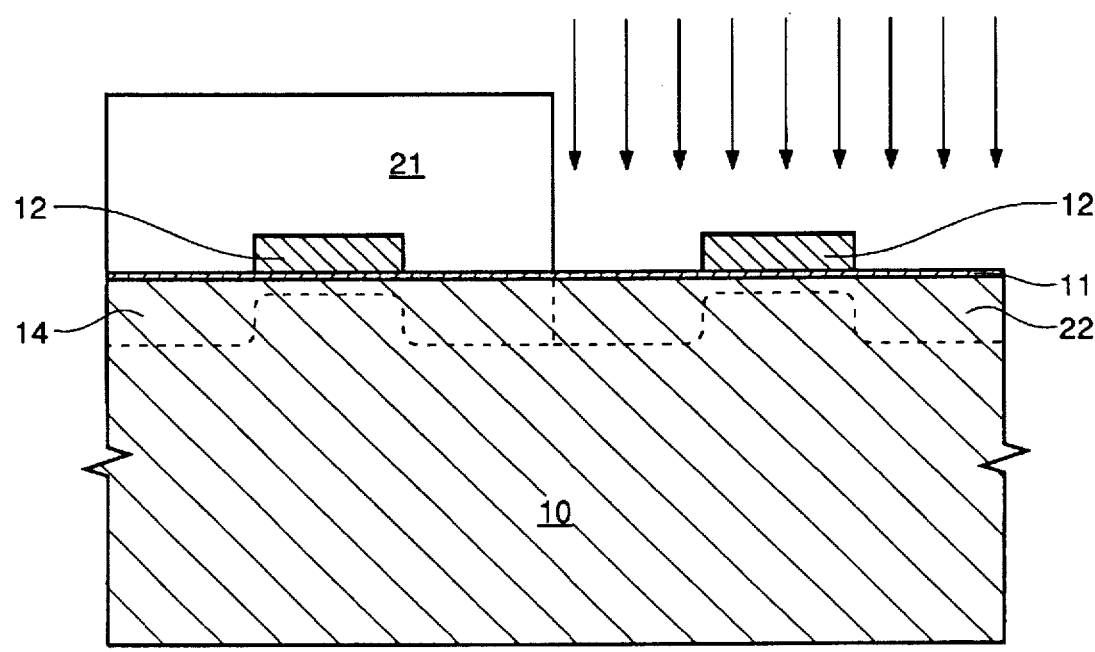
FIG. 2 depicts a second resist masking followed by a P-Well implant.
Figure 3:
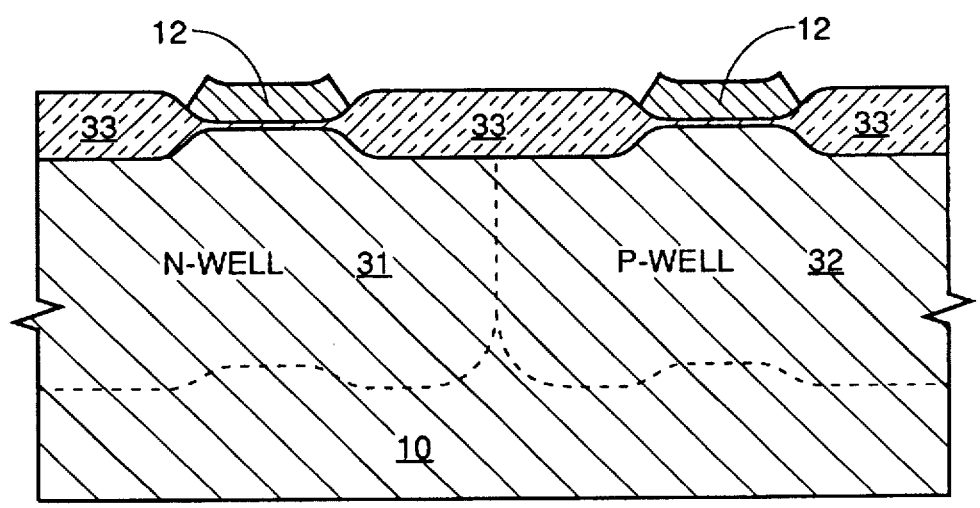
FIG. 3 depicts the formation of thick field oxide and diffusion of the dopants for the N-Well and the P-Well.

An illustrative example of the present invention is presented in the process steps depicted in FIGS. 1–3. FIGS. 1–3 show the formation of dual wells (N-Well and P-Well). However, if so desired the following process can be used for the formation of any number of well types, including a single well type.

Referring now to FIG. 1, a supporting substrate 10, such as silicon, is covered with a thin insulation layer 11 (e.g oxide). Next, a patterned barrier material 12, (e.g. an oxidation barrier such as nitride) is formed to define future active areas for active n-channel and p-channel devices. A masking layer 13 (e.g. photoresist) is patterned such that the regions left uncovered with masking layer 13 define one type of well region, such as the N-Well. At least one of the patterned barrier material 12 is left uncovered by the masking layer 13. An implant of dopant impurities is performed to force n-type dopants into supporting substrate 10, thus producing the dopant profile 14. This dopant profile 14 will later become the N-Well.

Referring now to FIG. 2, masking layer 13 is stripped and masking layer 21 is patterned such that the regions not covered with masking layer 21 define the P-Well. This mask is usually the compliment to masking layer 13 such that all N-Well regions defined by masking layer 13 are covered with masking layer 21. Next, an implant of dopant impurities is performed to force p-type dopants into supporting substrate 10, thus producing the dopant profile 22.

The energy of the above two implants must be high enough to penetrate the patterned barrier material 12 and thin insulation layer 11 and thus sufficiently penetrate into supporting substrate 10. For example, if insulating layer 11 is oxide and patterned barrier material 12 is nitride then it is preferred that the dopant impurities penetrate a silicon substrate approximately 500–1000Å. For boron, phosphorus and arsenic dopant impurities, each respective energy level is 120 keV, 340 keV and 720 keV, assuming a 2000Å nitride thickness.

Referring now to FIG. 3, resist 21 of FIG. 2 is stripped and a thick insulating layer 33 (e.g. field oxide) is formed in the regions unprotected by patterned barrier material 12. The dopants are driven further (via a well drive anneal) into the supporting substrate either in conjunction with or after the formation of thick insulating layer 33. After the well drive the difference in well depths due to the presence of patterned barrier material 12 becomes negligible (i.e. 2400Å versus 4 um).

If the thick insulating layer 33 is oxide, then an advantage of the process is seen in that the oxide may be grown in a dry oxygen ambient which in turn will also provide for the well drives due to the higher temperature and time required. The higher temperature oxidation will reduce the stress in the pad oxide under the patterned nitride, thereby reducing defects in the silicon and improving yield. This process also has the added advantage of eliminating the need of a sacrificial oxide to eliminate the Kooi effect because the Kooi effect only occurs when field oxidation is formed in a wet ambient.

The process then continues with threshold voltage implant adjustments, stripping the insulating layer 11 and formation of the gate dielectric layer for the future active n-channel and/or p-channel devices.

The present invention has been described using LOCOS isolation, but other methods may be employed (eg. trench, Poly Buffered LOCOS, etc.). Other techniques may be used to form the complimentary masking layers such as self-aligned methods designed to eliminate masking steps.

Furthermore, the present may be used in a planar well process as well. In a planar well process, it is necessary to from alignment marks in the substrate prior to defining the wells in a convention process (since the well formation does not create any topology to which subsequent layers may be aligned). This invention eliminates this requirement since the initial alignment marks are defined with the active area pattern.

Also, the present invention may be integrated into other processes, known to those skilled in the art. For example, a blanket P-Well may be performed rather than using a masking layer 21. The N-Well implant must be adjusted to compensate for the higher P-Well dopant in the N-Well. Multiple wells (i.e. triple, quadruple, etc.) may be formed with additional masking and implant steps.

Although an advantage cited is the elimination of the sacrificial oxide, the invention may be used in conjunction with a sacrificial oxide if deemed necessary. For instance, if the field oxide is performed in a steam ambient and the wells given a limited drive, then a sacrificial oxide would be required.

Although the present invention is described in a preferred embodiment, it will be apparent to one skilled in the art that changes and modifications may be made thereto, such as reversing the well polarities by forming the P-Well first by using a blanket N-Well with a masked P-Well, without departing from the spirit and scope of the invention as claimed.

I claim:

1. A process for forming at least one conductive well region in a supporting substrate for an integrated circuit, said process comprising the steps of:

forming an insulation layer on said supporting substrate;

patterning an active area defining barrier layer on said insulation layer while leaving said insulation layer intact, said step of patterning performed prior to performing a well region implant, said active area defining barrier layer thereby defining an active area for an active device;

performing said well region implant by introducing conductive impurities into said supporting substrate, said well region implant penetrating said active area defining barrier layer and placing said conductive impurities about said defined active area; and after said step of performing, said well region implant, growing field oxide insulation regions in a dry oxygen ambient on supporting substrate areas not covered by said patterned active area defining barrier layer while simultaneously forcing said conductive impurities into said supporting substrate to form said at least one well region, said field oxide insulation regions formed in the absence of a wet oxygen ambient.

2. The process of claim 1, wherein said supporting substrate comprises silicon.

3. The process of claim, 1, wherein said active area defining barrier layer comprises an oxidized active area defining barrier layer.

4. The process of claim 1, wherein said insulation layer and insulation regions comprise oxide and said active area defining barrier layer comprises nitride.

5. The process of claim 1, wherein said step of patterning an active area defining barrier layer on said insulation layer is performed before said step of performing said well region implant by introducing conductive impurities into said supporting substrate.

6. The process of claim 1, wherein said conductive impurities comprise impurities of a p-type conductivity.

7. The process of claim 1, wherein said conductive impurities comprise impurities of a n-type conductivity.

8. The process of claim 1, wherein said steps of forming said insulation regions in areas not covered by said patterned active area defining barrier layer and forcing said conductive impurities into said supporting substrate are performed during the same step.

9. A process for forming conductive well regions in a supporting substrate for an integrated circuit, said process comprising the steps of:

forming an insulation layer on said supporting substrate;

patterning first and second active area defining barriers on said insulation layer while leaving said insulation layer intact, said step of patterning performed prior to performing well region implants, said first and second active area defining barriers thereby defining first and second active areas;

performing a first well region implant by introducing impurities of a first type conductivity into said supporting substrate, said first well region implant penetrating said first active area defining barrier and placing said impurities of a first type conductivity about said defined first active area thereby forming a first well region doped to a first conductivity type;

masking over said first well region;

performing a second well region implant by introducing impurities of a second type conductivity into said supporting substrate, said second well region implant penetrating said second active area defining barrier and placing said impurities of a second type conductivity about said defined second active area thereby forming a second well region doped to a second conductivity type;

removing said masking; and after said steps of performing first and second well region implants, forming field oxide insulation regions in a dry oxygen ambient on supporting substrate areas not covered by said patterned first and second active area defining barriers while simultaneously forcing said impurities of first and second type conductivity into said supporting substrate thereby forming said conductive well regions, said field oxide insulation regions formed in the absence of a wet oxygen ambient.

10. The process of claim 9, wherein said supporting substrate comprises silicon.

11. The process of claim 9, wherein said first and second active area defining barriers comprises an oxidized first and second active area defining barriers.

12. The process of claim 9, wherein said insulation layer and insulation regions comprise oxide and said first and second active area defining barriers comprise nitride.

13. The process of claim 9, wherein said step of patterning said first and second active area defining barriers on said insulation layer, is performed before said steps of introducing impurities of first and second type conductivity into said supporting substrate.

14. The process of claim 9, wherein said impurities of a first type conductivity comprise impurities of a p-type conductivity.

15. The process of claim 14, wherein said impurities of a p-type conductivity comprise boron.

16. The process of claim 9, wherein said impurities of a second type conductivity comprise impurities of an n-type conductivity.

17. The process of claim 16, wherein said impurities of a n-type conductivity comprise arsenic.

18. The process of claim 16, wherein said impurities of a n-type conductivity comprise phosphorous.

19. The process of claim 9, wherein said steps of forming insulation regions in areas not covered by said patterned first and second active area defining barriers; and forcing said impurities of first and second type conductivity into said supporting substrate are performed during the same step.

20. A process for forming dual conductive wells in a silicon substrate for an integrated circuit, said process comprising the steps of:

forming an oxide layer on said silicon substrate;

patterning first and second active area defining oxide barriers on said oxide layer while leaving said oxide layer intact, said step of patterning performed prior to performing well region implants, said first and second active area defining oxide barriers thereby defining first and second active areas;

performing a first well region implant by introducing impurities of a p-type conductivity into said supporting substrate, said first well region implant penetrating said first active area defining oxide barrier and placing said impurities of a p-type conductivity about said defined first active area thereby forming a first well region doped to a p-type conductivity;

masking over said first well region;

performing a second well region implant by introducing impurities of a n-type conductivity into said supporting substrate, said second well region implant penetrating said second active area defining oxide barrier and placing said impurities of a n-type conductivity about said defined second active area thereby forming a second well region doped to a n-type conductivity;

removing said masking; and after said steps of performing first and second well region implants, forming field oxide insulation regions in a dry oxygen ambient on supporting substrate areas not covered by said patterned active area defining oxide barriers while simultaneously forcing said impurities of p-type and n-type conductivity into said silicon substrate thereby forming said dual well regions, said field oxide insulation regions formed in the absence of a wet oxygen ambient.

21. The process of claim 20, wherein said first and second active area defining oxide barriers comprise a nitride layer.

22. The process of claim 20, wherein said step of patterning said first and second active area defining oxide barriers on said insulation layer is performed before said steps of introducing impurities of p-type and n-type conductivity into said supporting substrate.

23. The process of claim 20, wherein said impurities of p-type conductivity comprise boron.

24. The process of claim 20, wherein said impurities of n-type conductivity comprise arsenic.

25. The process of claim 20, wherein said impurities of n-type conductivity comprise phosphorous.

26. The process of claim 20, wherein said steps of forming oxide regions in areas not covered by said patterned active area defining oxide barriers and forcing said impurities of p-type and n-type conductivity into said silicon substrate are performed during the same step.

27. A process for forming a conductive well in a supporting substrate for an integrated circuit, said process comprising the steps of:

forming an active area definition barrier prior to performing a well region implant, said active area definition layer thereby defining an active area for an active device;

performing said well region implant by introducing conductive impurities into said supporting substrate, said well region implant penetrating said active area definition layer and placing said conductive impurities about said defined active area to form said at least one conductively doped well region; and after said step of performing said well region implant, forming field oxide insulation regions in a dry oxygen ambient about the sides of said active area while simultaneously forcing said conductive impurities into said supporting substrate, said field oxide insulation regions formed in the absence of a wet oxygen ambient.

28. The process of claim 27, wherein said step of forming an active area definition barrier further comprises the steps of:

forming an insulation layer on said supporting substrate; and patterning a barrier layer on said insulation layer.

29. The process of claim 28, wherein said barrier layer comprises an oxidized barrier layer.

30. The process of claim 28, wherein said insulation layer and said insulation regions comprise oxide and said barrier layer comprises nitride.

31. The process of claim 28, wherein said step of patterning a barrier layer on said insulation layer is performed before said step of introducing conductive impurities into said supporting substrate.

32. The process of claim 27, wherein said step of forming an active area definition barrier is performed prior to said step of introducing conductive impurities into said supporting substrate.

33. The process of claim 27, wherein said supporting substrate comprises silicon.

34. The process of claim 27, wherein said conductive impurities comprise impurities of a p-type conductivity.

35. The process of claim 27, wherein said conductive impurities comprise impurities of a n-type conductivity.

36. A conductive well formed in a supporting substrate for an integrated circuit, said well formed by the steps of:

forming an active area definition barrier prior to performing a well region implant, said active area definition layer thereby defining an active area for an active device;

performing said well region implant by introducing conductive impurities into said supporting substrate, said well region implant penetrating said active area definition layer and placing said conductive impurities about said defined active area to form said at least one conductively doped well region; and after said step of performing said well region implant, forming field oxide insulation regions in a dry oxygen ambient on supporting substrate areas about the sides of said active area while simultaneously forcing said conductive impurities into said supporting substrate, said field oxide insulation regions formed in the absence of a wet oxygen ambient.

37. The conductive well of claim 36, wherein said step of forming an active area definition barrier further comprises the steps of:

forming an insulation layer on said supporting substrate; and patterning a barrier layer on said insulation layer.

38. The conductive well of claim 36, wherein said step of forming an active area definition barrier is performed prior to said step of introducing conductive impurities into said supporting substrate.

39. The conductive well of claim 36, wherein said supporting substrate comprises silicon.

40. The conductive well of claim 36, wherein said barrier layer comprises an oxidized barrier layer.

41. The conductive well of claim 36, wherein said insulation layer and said insulation regions comprise oxide and said barrier layer comprises nitride.

42. The conductive well of claim 36, wherein said step of patterning a barrier layer on said insulation layer is performed before said step of introducing conductive impurities into said supporting substrate.

43. The conductive well of claim 36, wherein said conductive impurities comprise impurities of a p-type conductivity.

44. The conductive well of claim 36, wherein said conductive impurities comprise impurities of a n-type conductivity.

45. A method of forming well regions in a semiconductor wafer, comprising the steps of:

providing a semiconductor wafer;

depositing an oxide layer over said semiconductor wafer to form a wafer assembly;

forming a first patterned mask layer over said oxide layer, said first patterned mask layer defining active area sites;

masking a first portion of said wafer assembly with a first implant mask, leaving a second portion of said wafer assembly exposed for implanting;

implanting first impurities into the semiconductor wafer at said second portion of wafer assembly, said implant performed through said oxide layer;

masking at least a part of said second portion of said wafer assembly with a second implant mask, leaving at least a part of said first portion exposed for implanting;

implanting second impurities into the semiconductor wafer at said exposed part of said first portion of said wafer assembly, said implant performed through said oxide layer;

removing said second implant mask; and exposing said wafer assembly to conditions sufficient to dry oxidize portions not covered by said first patterned mask layer to form field oxide insulation regions thereon and to drive said first and second implants into said semiconductor wafer, said field oxide insulation regions formed in the absence of a wet oxygen ambient.

* * * * *